United States Patent [19]

Hur

[11] Patent Number: 5,670,298
[45] Date of Patent: Sep. 23, 1997

[54] METHOD OF FORMING A METAL PATTERN IN MANUFACTURING A SEMICONDUCTOR DEVICE

[75] Inventor: Hoon Hur, Seoul, Rep. of Korea

[73] Assignee: LG Semicon Co., Ltd., Chungcheongbuk-do, Rep. of Korea

[21] Appl. No.: 583,766

[22] Filed: Jan. 11, 1996

Related U.S. Application Data

[63] Continuation of Ser. No. 76,547, Jun. 14, 1993, abandoned.

[30] Foreign Application Priority Data

Jun. 17, 1992 [KR] Rep. of Korea ............... 10484/1992

[51] Int. Cl.$^6$ ........................................... G03F 7/20
[52] U.S. Cl. ............... 430/318; 430/313; 156/659.11; 216/41
[58] Field of Search ..................... 430/311, 313, 430/317, 318, 329; 156/643.1, 659.11; 437/228, 229, 331; 216/41

[56] References Cited

U.S. PATENT DOCUMENTS

| | | | |
|---|---|---|---|
| 4,820,611 | 4/1989 | Arnold | 430/271 |
| 5,068,207 | 11/1991 | Manocha | 437/231 |
| 5,126,289 | 6/1992 | Ziger | 437/231 |
| 5,286,608 | 2/1994 | Koh | 430/313 |

*Primary Examiner*—Kathleen Duda
*Attorney, Agent, or Firm*—Morgan, Lewis and Bockius LLP

[57] ABSTRACT

A method a metal pattern on a substrate. The method comprises the steps of forming a metal film on the substrate, forming a porous film on the metal film, forming a photoresist pattern on the porous film, and etching the metal film and the porous film using the photoresist pattern as a mask to thereby form the metal pattern. During the step of forming the photoresist pattern on the porous film, the porous film causes the scattering of light incident on the porous film to thereby cause a mutual interference of the light.

6 Claims, 4 Drawing Sheets

METHOD OF FORMING A METAL PATTERN IN MANUFACTURING A SEMICONDUCTOR DEVICE

This application is a continuation, of application Ser. No. 08/076,547, filed Jun. 14, 1993 now abandoned.

BACKGROUND OF THE INVENTION

The present invention relates to a method of making a metal pattern in manufacturing a semiconductor device, and more particularly to a method capable of preventing a notching phenomenon of a photoresist pattern due to light reflection at the metal film upon performing an exposure process of a photolithography process.

In manufacturing a semiconductor device, a photolithography process is accomplished by printing a designed pattern of a semiconductor circuit with a photoresist on a wafer.

This process will hereinafter be described briefly.

First, a photoresist is coated on a wafer.

Over the surface of the photoresist is aligned a mask in which a pattern is formed.

Thereafter, the photoresist formed on the wafer is subjected to an exposure process and a developing process, in this order, thereby forming a photoresist pattern which is the same as the pattern formed in the mask, on the wafer.

Upon defining patterns of a semiconductor device using the photolithography process, as above mentioned, the minimum pattern size is reduced to a submicron under 0.5 μm (≦0.5 μm) as the integration degree of the semiconductor device is increased.

Therefore, in cases using a photoresist consisting of only a single layer, several problems are generated.

Namely, they are a notching phenomenon which is generated at a portion of the photoresist pattern by light reflected from a substrate, an approximity effect which is generated by the profile difference of defined photoresist pattern at a portion having a high pattern density or a low pattern density, and a necking and a bridge which are generated due to the difference of focus thickness upon the occurrence of global step-difference.

A ratio of height to width in connection with the defined photoresist pattern, namely, an aspect ratio is also increased as the minimum pattern size is reduced to a submicron under 0.5 μm.

Therefore, a peeling phenomenon is generated at the designed phenomenon pattern upon performing a wet-developing process.

Referring to FIG. 1, there is illustrated a process of making a metal pattern which electrically connects each element to one another in a semiconductor device, using a photolithography process, of processes manufacturing a semiconductor device.

First, a metal film 12 is deposited on a semiconductor substrate 11 using a chemical vapour deposition(CVD) method as shown in FIG. 1a and then a photoresist film 13 is coated on the metal film 12 as shown in FIG. 1b.

Subsequently, a mask 14 having a desired pattern therein is aligned on the surface of the photoresist film 13 which is formed on the metal film 12, as shown in FIG. 1c.

Subsequently, the photoresist film 13 is subjected to an exposure process and a developing process in this order after aligning the mask 14 on the photoresist 13, so as to form a photoresist pattern 13-1 shown in FIG. 1d.

The metal film 12 is anisotropically etched using the photoresist pattern 13-1 as an etch mask, thereby obtaining a metal pattern 12-1 shown in FIG. 1e.

However, the above-method of making a metal pattern has the following problem.

That is, upon performing the exposure process, light is irradiated on a portion 13-2 of the photoresist 13 to be removed via the subsequent developing process and a part of the irradiated light is diffusely reflected toward the photoresist pattern 13-1 to be remained via the sequent developing process due to the metal film 12, as shown in FIG. 1c.

As a result, the light reflected diffusely toward the photoresist pattern 13-1 is irradiated on the photoresist pattern 13-1, thereby causing a notching phenomenon to occur on the photoresist pattern 13-1.

An anti-reflecting coating (ARC) process is generally used, so as to restrain the notching phenomenon which may occur upon carrying out a photolithography process for forming a metal pattern.

In the ARC process, for example, there is widely used an inorganic ARC process which reduces the light reflection of metal film formed under the photoresist pattern, an organic ARC process which uses a polymer as a coating material may also be used.

Referring to a FIG. 2a to FIG. 2c, there is illustrated a method of making a metal pattern using the Inorganic ARC process.

As shown in FIG. 2a, over the surface of a semiconductor substrate 21 there is first deposited with a CVD method a metal film 22 in which the light reflection is severely generated upon the performance of exposure process, and hence a notching phenomenon is caused at a photoresist pattern.

Thereafter, an ARC film 23 such as TiN, $Si_3N_4$ and TiW is coated with a predetermined thickness on the metal film 22.

Subsequently, a photoresist film 24 is coated on the ARC film 23 as shown in FIG. 2b and the photoresist film 24 is subjected to a photolithography process and an etch process using an mask having a pattern, in this order, thereby obtaining a photoresist pattern 24-1 shown in FIG. 2c.

But not shown in drawings, subsequently, the ARC film 23 and the metal film 24 is etched in this order using the photoresist pattern 24-1 as an etch mask to form an ARC film pattern and a metal film pattern and then the remaining ARC film pattern is removed, thereby obtaining a desired metal pattern film.

As hereinbefore mentioned, according to the method of making a metal pattern film using a ARC film, there is an advantage in that a notching phenomenon can be restrained at the photoresist pattern 24-1 to be remained upon performing a developing process since the ARC film 23 reduces the diffused reflection of light incident to a portion 24-2 of the photoresist film 24 to be removed upon performing an exposure process, in different from the case of FIG. 1a to FIG. 1e.

According to the above-method, however, there is a disadvantage in that the ARC film 23 should be formed on the metal film 22 with an exact thickness, so as to restrain the reflection of light and hence preferably control the reflection degree of light.

It is also impossible to completely restrain the reflection of light since the diffused reflection light has a constant reflection direction, of light reflected on the ARC film 23 which is located beneath the photoresist film 24-2 to be removed upon performing a developing process.

Therefore, a notching phenomenon may be generated although the ARC film 23 is formed on the metal film 22.

SUMMARY OF THE INVENTION

Therefore, an object of the invention is to eliminate the above-mentioned disadvantages encountered in the conventional arts and to provide a method of forming a metal pattern film in manufacturing a semiconductor device which is capable of more restraining the notching phenomenon of photoresist pattern using a porous film.

In one aspect, the present invention provides a method of forming a metal pattern film in manufacturing a semiconductor device comprising the steps of: forming a metal film on a semiconductor substrate;

forming a photoresist film on the porous film;

performing a photolithography process on the photoresist, thereby forming a photoresist pattern;

patterning the porous film and the metal film using the photoresist pattern as an etch mask; and removing the remaining porous film pattern, thereby leaving only the metal film pattern remaining.

BRIEF DESCRIPTION OF THE DRAWINGS

Other objects and aspects of the invention will become apparent from the following description of an embodiment with reference to the accompanying drawings in which.

DETAILED DESCRIPTION OF THE PREFERRED EMBODIMENT

Figure 3A:
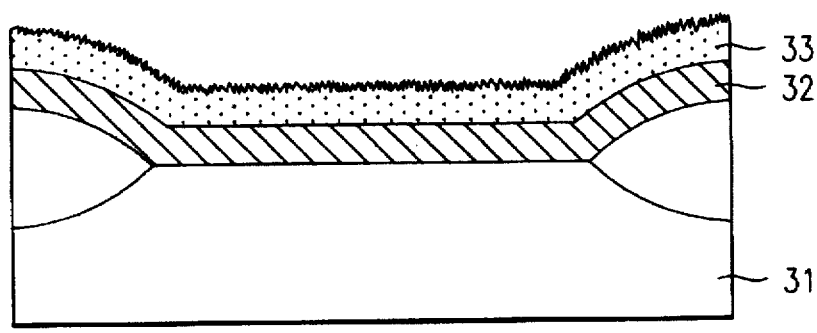
FIGS. 3a to 3c are sectional views illustrating a method of forming a metal pattern in accordance with the present invention.
Figure 3B:
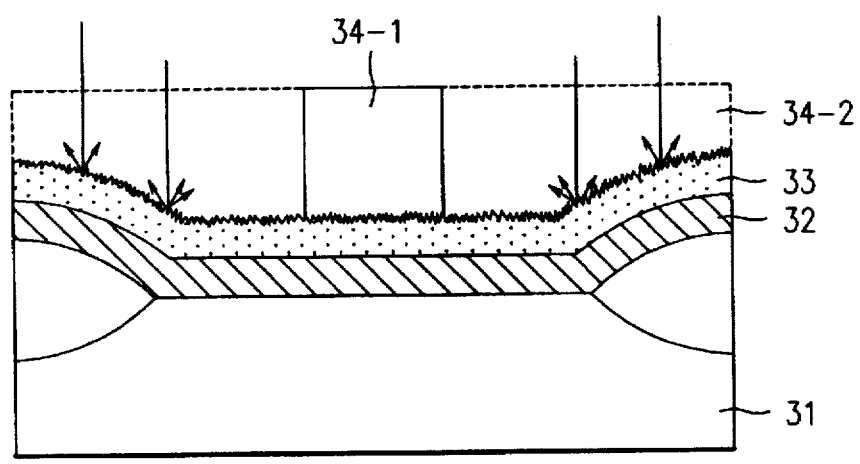
Figure 3C:
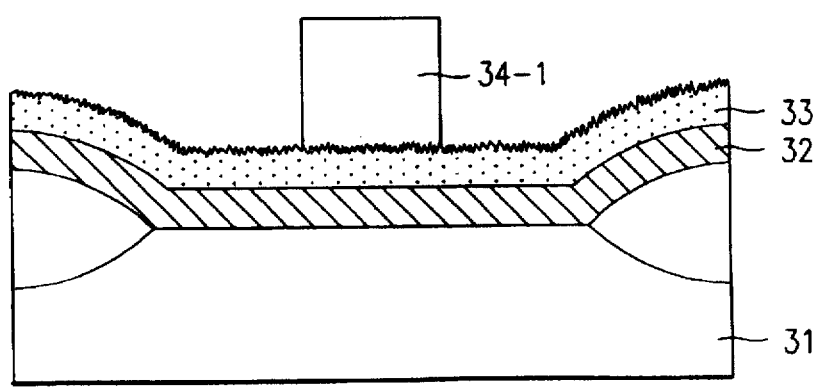

FIGS. 3a to 3c illustrate an improved method of forming a metal pattern using a porous ARC film in accordance with the present invention.

As shown in FIG. 3a, a metal film 32 is formed on a semiconductor substrate 31 using a CVD method and then an a porous film 33, such as an $O_3$/TEOS oxide film is coated on the metal film 32 under a low temperature.

Subsequently, a photoresist film 34 is formed on the porous film 33 as shown in FIG. 3b and then the photoresist film 34 is subjected to a photolithography process using a mask having a pattern, thereby forming a photoresist pattern 34-1 shown in FIG. 3c.

As not shown in drawings, subsequently, the metal film 32 and the porous film 33 are patterned using the remaining photoresist pattern 34-1 as an etch mask. The remaining porous film 33 is then removed to form a desired metal pattern film.

As above mentioned, since the present invention uses a porous oxide as a material of the porous film 33, the surface of the porous film 33 has a wrinkled shape, as shown in FIG. 3b.

Figure 1A:
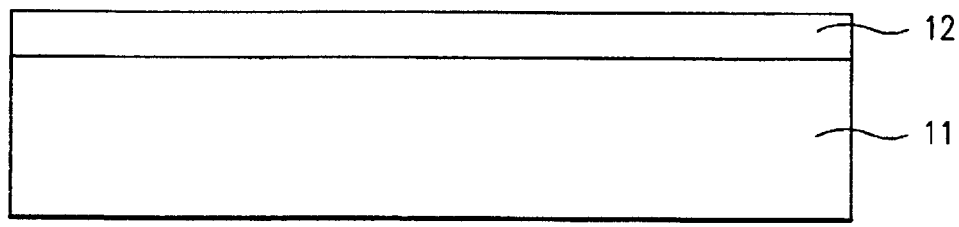
FIGS. 1a to 1e are sectional views illustrating a general method of forming a metal film pattern.
Figure 1B:
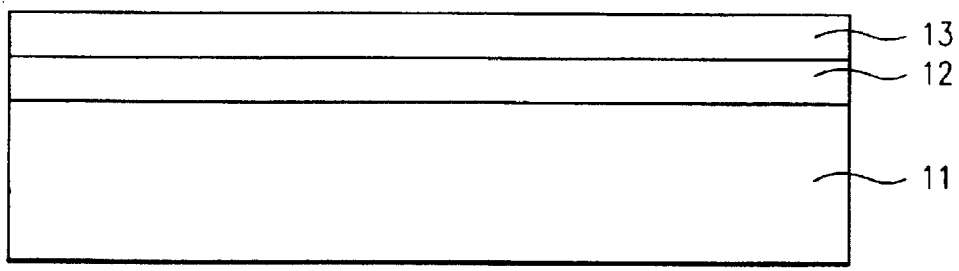
Figure 1C:
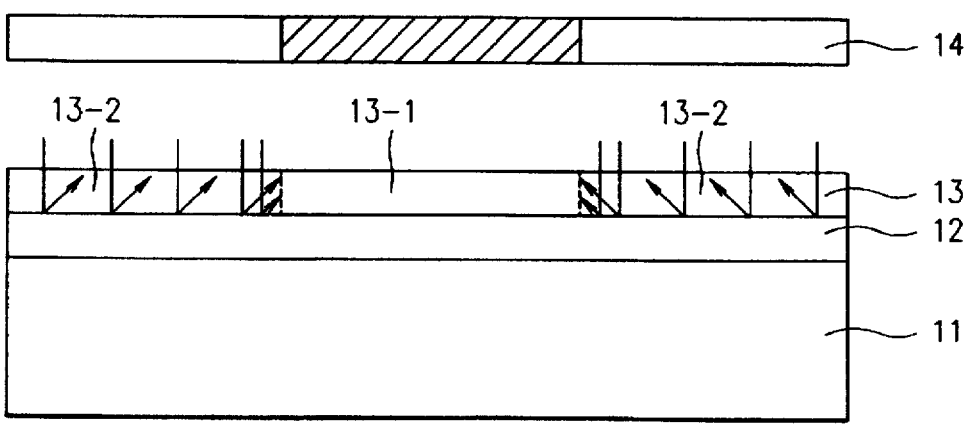
Figure 1D:
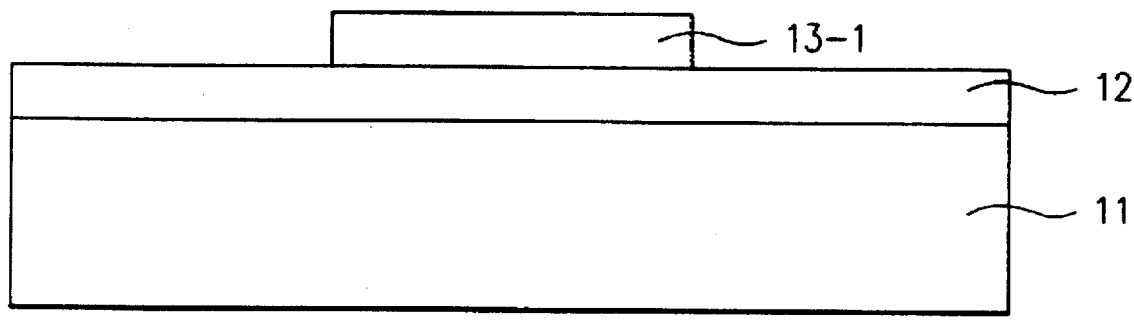
Figure 1E:
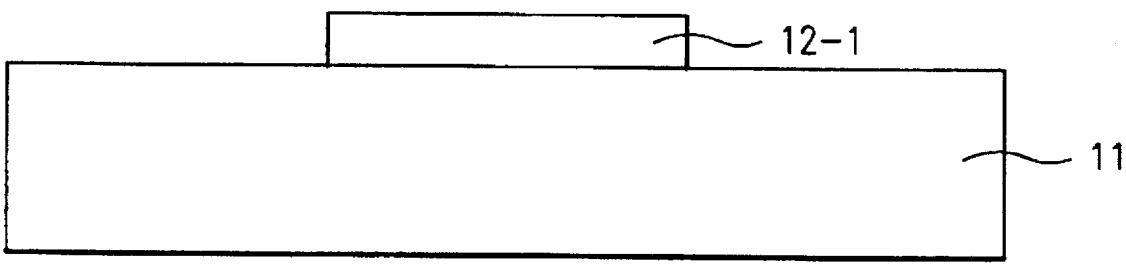
Figure 2A:
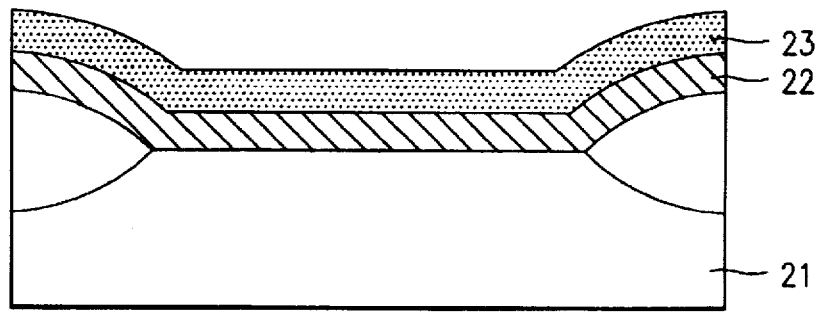
FIGS. 2a to 2c are sectional views illustrating a conventional method of forming a metal film pattern using an ARC process.
Figure 2B:
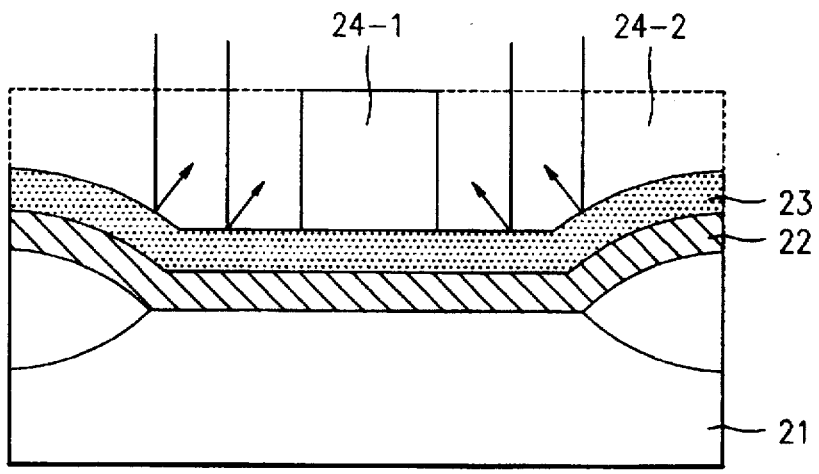
Figure 2C:
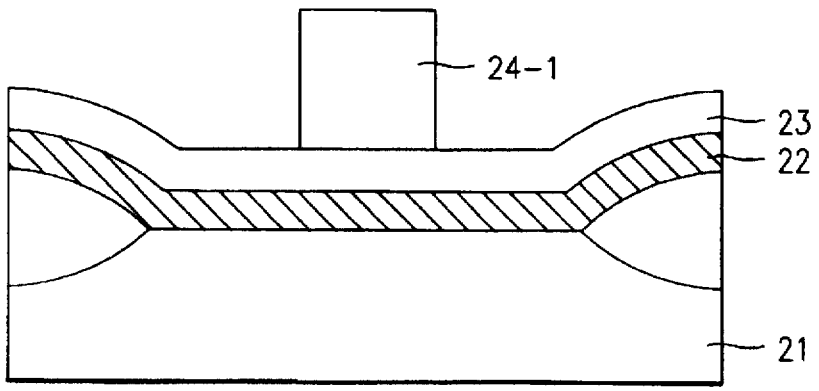

As shown in FIG. 3b, therefore, the diffused reflection light has too much non-direction of light reflected on the porous film 33 which is located beneath a portion 34-2 of the photoresist to be removed upon performing a developing process, as compared with the case of FIG. 2.

As a result, the reflection light having non-directions reflected on the porous film 33 have mutual interference effects each other. Therefore, it is possible to restrain incident light components which cause a notching phenomenon upon substantially defining a photoresist pattern.

As above mentioned, since the present invention uses the surface morphology state(namely, porous state) of inorganic film which is used as a porous film so as to cause the scattering of light, it is possible to restrain the notching phenomenon at the photoresist pattern.

What is claimed is:

1. A method of forming a metal pattern on a substrate, comprising the steps of:

forming a metal film on the substrate;

forming a porous film on the metal film;

forming a photoresist pattern on the porous film; and etching the metal film and the porous film using the photoresist pattern as a mask to thereby form the metal pattern, wherein during the step of forming the photoresist pattern on the porous film, the porous film causes the scattering of light incident on the porous film to thereby cause a mutual interference of the light.

2. The method of claim 1, wherein the porous film comprises a porous oxide film.

3. The method of claim 2, wherein the porous oxide film is an $O_3$/TEOS oxide film.

4. The method of claim 1, wherein the porous film comprises an inorganic porous film.

5. The method of claim 1, wherein the porous film has a wrinkled surface.

6. The method of claim 1, wherein the scattering of the light incident on the porous film restrains a notching phenomenon at the photoresist pattern.

* * * * *